United States Patent
Cai et al.

(10) Patent No.: US 9,946,155 B2
(45) Date of Patent: Apr. 17, 2018

(54) PHOTOLITHOGRAPHIC MASK

(71) Applicant: Semiconductor Manufacturing International (Shanghai) Corporation, Shanghai (CN)

(72) Inventors: Boxiu Cai, Shanghai (CN); Yi Huang, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 15/793,579

(22) Filed: Oct. 25, 2017

(65) Prior Publication Data
US 2018/0046074 A1 Feb. 15, 2018

Related U.S. Application Data

(62) Division of application No. 14/800,877, filed on Jul. 16, 2015, now Pat. No. 9,829,788.

(30) Foreign Application Priority Data

Aug. 26, 2014 (CN) .......................... 2014 1 0425884

(51) Int. Cl.
*G03F 1/82* (2012.01)
*G03F 1/36* (2012.01)

(52) U.S. Cl.
CPC . *G03F 1/82* (2013.01); *G03F 1/36* (2013.01)

(58) Field of Classification Search
USPC .............................................. 430/5
See application file for complete search history.

(56) References Cited

U.S. PATENT DOCUMENTS 8,313,992 B2 11/2012 Huang et al.
8,715,891 B2 5/2014 Higaki

*Primary Examiner* — Christopher G Young
(74) *Attorney, Agent, or Firm* — Anova Law Group, PLLC

(57) ABSTRACT

A method is provided for fabricating a photolithographic mask. The method includes providing a transparent substrate; and forming an opaque layer on the transparent substrate. The method also includes writing layout patterns with at least one sub-resolution assistant feature with non-uniform size along a longitudinal direction to increase an adhesion force between the sub-resolution assistant feature with non-uniform size along the longitudinal direction and the transparent substrate in the opaque layer. Further, the method include cleaning residual matters generated by writing the layout patterns in the opaque layer. Further, the method also includes spin-drying the transparent substrate with the layout patterns and the sub-resolution assistant feature with non-uniform size along the longitudinal direction.

12 Claims, 8 Drawing Sheets

PHOTOLITHOGRAPHIC MASK

CROSS REFERENCE TO RELATED APPLICATIONS

This application is a divisional of U.S. patent application Ser. No. 14/800,877, filed on Jul. 16, 2015, which claims the priority of Chinese patent application No. 201410425884.5, filed on Aug. 26, 2014, the entirety of all of which is incorporated herein by reference.

FIELD OF THE INVENTION

The present invention generally relates to the field of semiconductor technology and, more particularly, relates to photolithographic masks and fabrication processes thereof.

BACKGROUND

In a photolithography process, the layout patterns on a photolithographic mask are transferred to the photoresist layer formed on a semiconductor substrate by an optical exposure process. The layout patterns may be chip patterns or align marks, etc.

FIG. 1 illustrates an existing photolithographic mask. As shown in FIG. 1, the layout patterns on the photolithographic mask includes dense features 1 and isolated features 2. The dense features 1 include a plurality of parallel first stripes 11; and the isolated main features 2 include a plurality of second stripes 21. The distribution density of the first stripes 11 are greater than the distribution density of the second stripes 21. That is, the distance between adjacent first stripes 11 is greater than the distance between adjacent second stripes 21.

During a photolithography process, the exposure light transmits through the transparent areas of the photolithographic mask to expose the photoresist layer formed on a semiconductor substrate. The exposure light is scattered in the photoresist layer; and scattering light is formed. The edge portions of the photoresist layer corresponding to the first stripes 11 and the second stripes 21 are affected by the scattering light. However, due to the difference between the distribution density of the first stripes 11 and the second stripes 21, the exposure window (transparent area) size between adjacent first stripes 11 are smaller than the exposure window size between adjacent second stripes 21. Thus, the effect to the edges of the first stripes 11 caused by the scattering light is different from the effect to the edges of the second stripes 21 caused by the scattering light. Therefore, the error of the feature size of the first stripes 11 are different from the error of the feature size of the second stripes 21.

In order to solve the error difference between the first stripes 11 and the second stripes 21, referring to FIG. 1, at least one Sub-Resolution Assistant Feature (SRAF) 22 is formed between adjacent second stripes 21. The SRAFs 22 are also stripes to cause that the distribution density of the second stripes 21 and the SRAFs 22 are identical to the distribution density of the first stripes 11. Thus, the exposure window size in the dense patterns 1 and the exposure window size in the isolated patterns 2 are similar. During an exposure process, the SRAFs 22 are able to compensate the effect to adjacent second stripes 22 caused by the scattering light. Therefore, the feature size error of the first stripes 11 may be identical to the feature size error of the second stripes 21. Further, the feature size of the SRAFs 22 is smaller than the resolution of the exposure apparatus, the SRAFs 22 are not transferred into the photoresist layer, thus the SRAFs may be referred as non-printable SRAFs.

The method for forming the photolithographic mask having the layout patterns illustrated in FIG. 1 includes sequentially providing a substrate having a mask layer; forming a photoresist layer on the mask layer; patterning the photoresist layer to define the position of the layout patterns; forming the layout patterns by a dry etching process to etch the mask layer using the patterned photoresist layer as an etching mask; cleaning the residues of the dry etching process, such as reaction products, or contaminations, etc., using a cleaning agent; and spin-drying the substrate to remove the residual cleaning agent. Because the feature size of the SRAFs 22 is substantially small, during the spin-drying process, the SRAFs 22 may be tilt, and/or peel off. Thus, the SRAFs 22 may be unable to compensate the scattering light during the exposure process. The disclosed structures and methods are directed to solve one or more problems set forth above and other problems.

BRIEF SUMMARY OF THE DISCLOSURE

One aspect of the present disclosure includes a method for fabricating a photolithographic mask. The method includes providing a transparent substrate; and forming an opaque layer on the transparent substrate. The method also includes writing layout patterns with at least one sub-resolution assistant feature with non-uniform size along the longitudinal direction to increase an adhesion force between sub-resolution assistant feature with non-uniform size along the longitudinal direction and the transparent substrate in the opaque layer; and cleaning residual matters generated by writing the layout patterns and the sub-resolution assistant feature with non-uniform size along the longitudinal direction in the opaque layer. Further, the method includes spin-drying the transparent substrate with the layout patterns and the sub-resolution assistant feature with non-uniform size along the longitudinal direction.

Another aspect of the present disclosure includes a photolithographic mask. The photolithographic mask includes a transparent substrate. The photolithographic mask also includes an opaque layer formed on the transparent substrate. Further, the method includes layout patterns and at least one sub-resolution assistant feature with non-uniform size along the longitudinal direction formed in the opaque layer.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 11A:
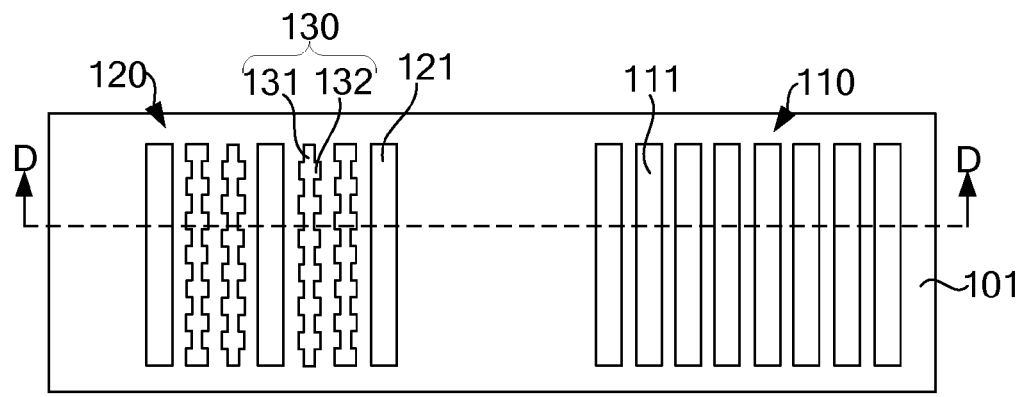
Figure 11B:
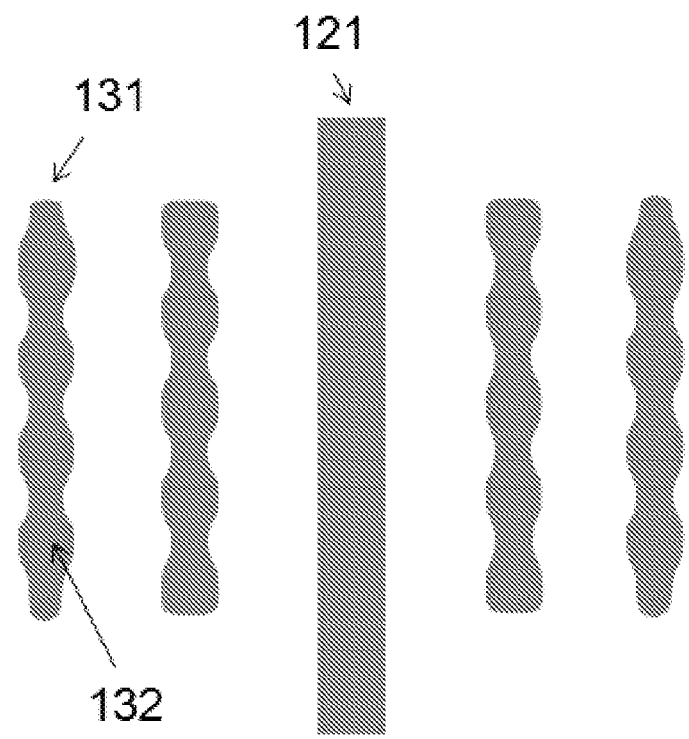
Figure 12:
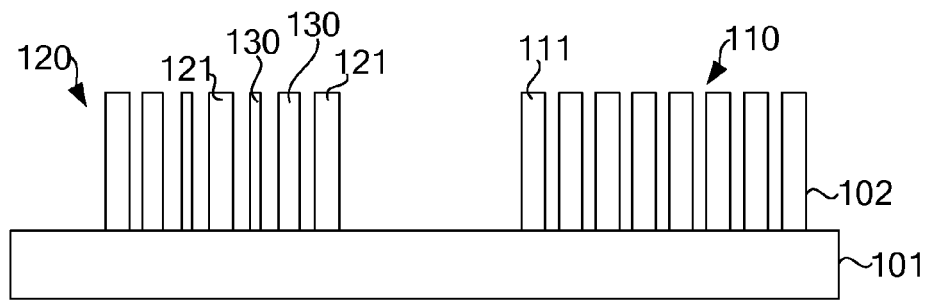
Figure 13:
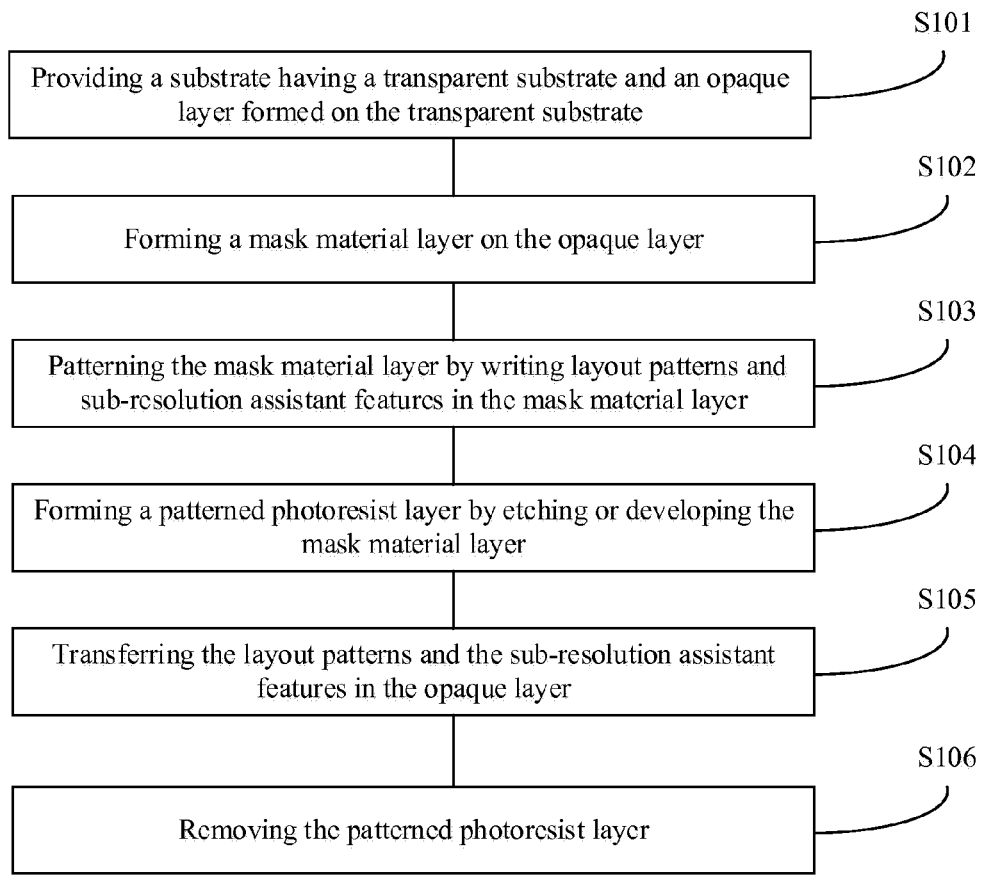
FIG. 13 illustrates an exemplary fabrication method of a photolithographic mask consistent with the disclosed embodiments.

FIG. 13 illustrates an exemplary fabrication method of a photolithographic mask consistent with the disclosed embodiments; and FIGS. 2-12 illustrate structures corresponding to certain stages of the exemplary fabrication method of the photolithographic mask consistent with the disclosed embodiments.

Figure 2:
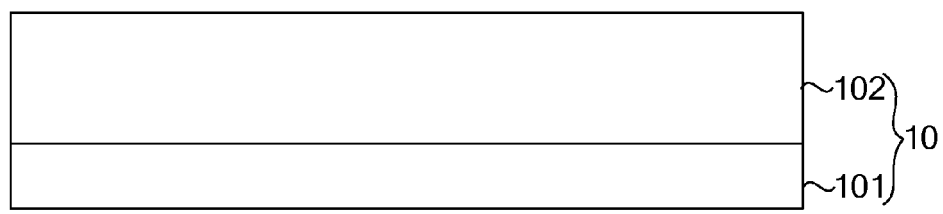
FIGS. 2-9, FIGS. 10A-10D, FIGS. 11A-11B and FIG. 12 illustrate structures corresponding to certain stages of an exemplary fabrication method of a photolithographic mask consistent with the disclosed embodiments.

As shown in FIG. 13, at the beginning of the fabrication process, a substrate with certain structures is provided (S101). FIG. 2 illustrates a corresponding structure.

As shown in FIG. 2, a substrate 10 is provided. The substrate 10 includes a transparent substrate 101 and an opaque layer 102 formed on the transparent substrate 101.

The exposure light may transmit through the transparent substrate 101 during the photolithography process. The transparent substrate 101 may be made of any appropriate material, such as glass, quartz, fused silica, or plastic, etc. In one embodiment, the transparent substrate 101 is made of fused silica. The transparent substrate 101 provides a base for subsequent processes and structures.

The opaque layer 102 may be used to subsequently form layout patterns and sub-resolution assistant features (SRAFs). The opaque layer 102 may block the exposure light used in the photolithography process; and transfer the subsequently formed layout patterns to a photoresist layer for forming semiconductor devices and structures. The opaque layer 102 may be a single layer structure, or a multiple-stacked structures. In one embodiment, the opaque layer 102 is a single layer structure made of any appropriate metal, such as Cr, or Ti, etc. The metal material may provide the subsequently formed layout patterns and SRAFs with a significantly high strength.

In certain other embodiments, the opaque layer 102 may include a metal layer and a light blocking layer formed on the metal layer. Various processes may be used to form the opaque layer 102, such as a sputtering process, a physical vapor deposition (PVD) process, or a chemical plating process, etc.

Figure 3:
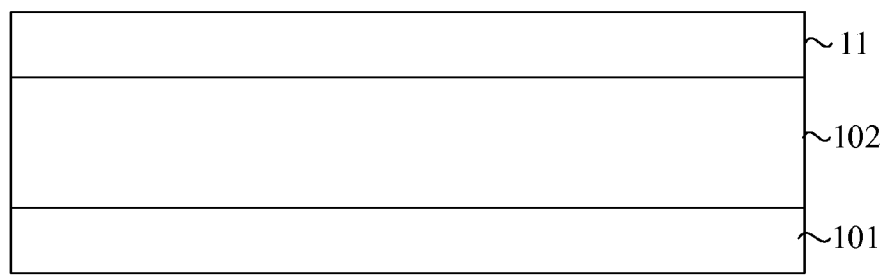

Returning to FIG. 13, after providing the substrate 10, a mask material layer may be formed (S102). FIG. 3 illustrates a corresponding structure.

As shown in FIG. 3, a mask material layer 21 is formed on the opaque layer 102. The mask material layer 21 may be used to subsequently form a patterned mask layer for subsequently forming the layout patterns and SRAFs in the opaque layer 102.

In one embodiment, the mask material layer 21 is made of photoresist. Thus, the mask material layer 21 may be referred as a photoresist layer 21. The photoresist layer 21 may be formed by any appropriate process. In one embodiment, a spin-coating process is used to form the photoresist layer 11.

In certain other embodiments, the mask material layer 21 may be made of a hard material layer. The hard material layer may be made of any appropriate material, such as TiN, SiN, SiO$_2$, or SiNO, etc. Various processes may be used to form the mask material layer 21 made of hard material, such as a chemical vapor deposition (CVD) process, or a physical vapor deposition (PVD) process, etc.

Figure 4:
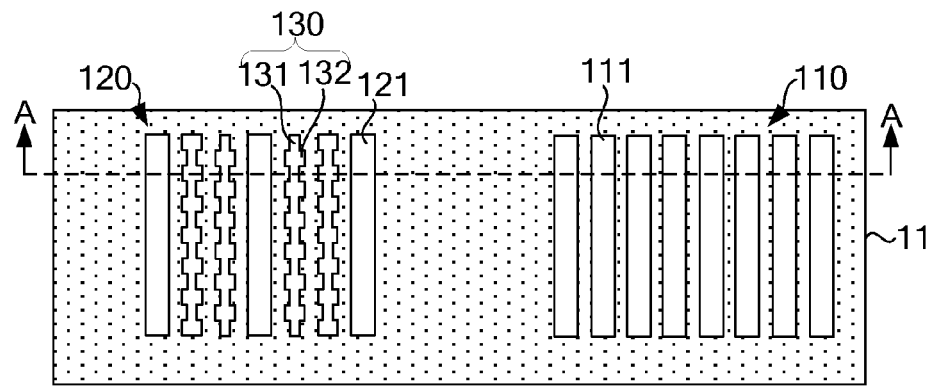
Figure 5:
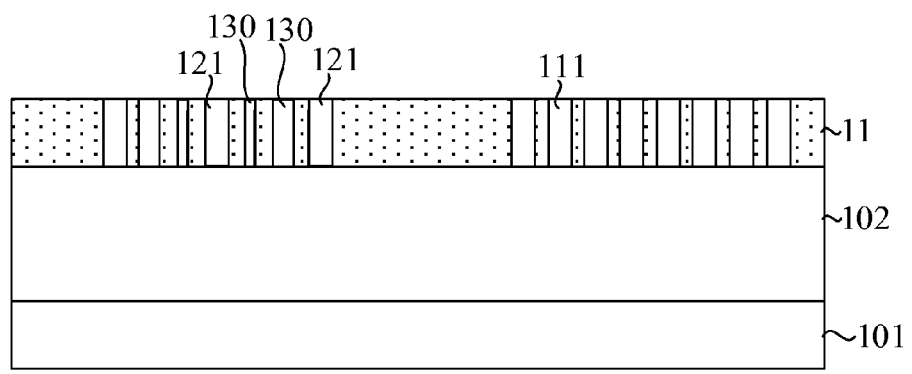

Returning to FIG. 13, after forming the mask material layer 21, the mask material layer 21 may be patterned (S103). FIGS. 4-5 illustrate a corresponding structure; and the FIG. 5 illustrates a cross-section view of the structure illustrated in FIG. 4 along the "AA' direction.

As shown in FIGS. 4-5, the mask material layer 21 is patterned to form layout patterns and SRAFs; and define the positions of the layout patterns and the SRAFs. That is, dense patterns 110 and isolated patterns 120 are formed in the mask material layer 21. Further, SRAFs 130 are formed between adjacent isolated patterns 120.

Referring to FIGS. 4-5, the layout patterns includes the dense patterns 110 and the isolated patterns 120. The dense patterns 110 may include a plurality of the parallel first stripes 111; and the isolated patterns 120 may include a plurality of parallel second stripes 121. The distribution density of the plurality of the first stripes 111 may be greater than the distribution density of the plurality of the second stripes 121. That is, the distance between adjacent first stripes 111 may be smaller than the distance between adjacent second stripes 121.

At least one SRAF 130 may be disposed between adjacent second stripes 121. In one embodiment, two SRAFs 130 are disposed between adjacent second stripes 121; and the total distribution density of the second stripes 121 and the SRAFs 130 may be approximately equal to the distribution density of the first stripes 111.

Further, referring to FIGS. 4-5, the SRAFs 130 may have non-uniform size along the longitudinal direction. That is, each of the SRAFs 130 may include a stripe pattern 131 and a plurality of protruding parts 132. The protruding parts 132 may be disposed on the side surfaces of the stripe pattern 131 with a pre-determined interval along the longitudinal direction of the SRAF 130. The strip patterns 131 of the SRAFs 130 may be parallel to the second stripes 121. The SRAFs 130 may be used to compensate the scattering effect between adjacent second stripes 121 such that the feature size error of the first stripes 111 may be identical to the feature size error of the second stripes 121.

The width of the first stripes 111 and the width of the second stripe 121 may be greater the resolution of the exposure apparatus. Thus, the first stripes 111 and the second stripes 121 may be transferred to a photoresist layer during a photolithography process. The width of the SRAFs 130 may be smaller than the resolution of the exposure apparatus. Thus, the SRAFs 130 may not be transferred to the photoresist layer during the photolithography process. Therefore, the SRAFs 130 may be referred as non-printable SRAFs 130.

In one embodiment, the feature size of the first stripes 111 is identical to the feature size of the second stripes 121. In certain other embodiments, the feature size of the first stripes 111 may be different from the feature size of the second stripes 121.

In one embodiment, the number of the SRAFs 130 between adjacent second stripes 121 is two. In certain other embodiment, the number of the SRAFs 130 between adjacent second stripes 121 may be determined by the difference between the distribution density of the first stripes 111 and the second stripes 121 such that the distribution density of the first stripes 111 may be approximately equal to the distribution density of the second stripes 121.

In one embodiment, the length of the SRAFs 130 is approximately equal to the length of the second stripes 121. In certain other embodiments, the length of the SRAFs 130 may be other appropriate value as long as the SRAFs 130 are able to compensate the scattering effect of the second stripes 121 during the photolithography process.

Figure 10A:
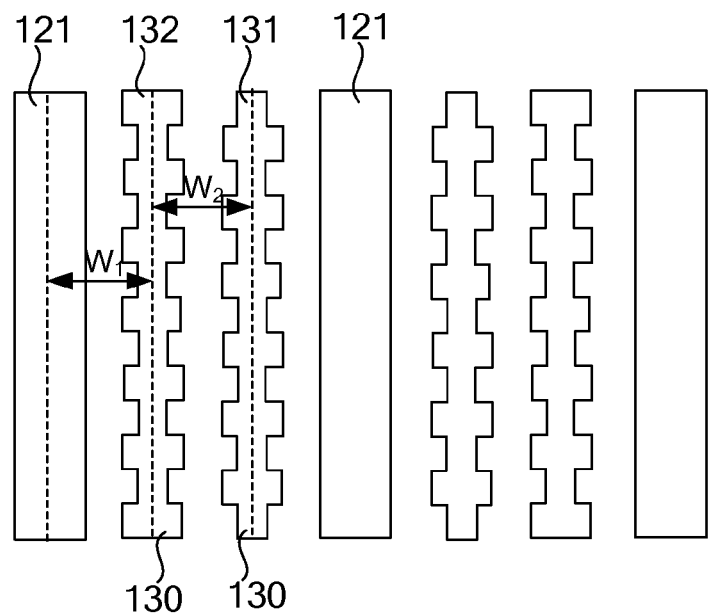

Further, referring to FIG. 10A, in one embodiment, two SRAFs 130 are disposed between two adjacent second stripes 121. The protruding parts 132 of one SRAF 130 may face portions of the stripe pattern 131 between adjacent protruding parts 132 of the other SRAF 130. Such an arrangement may preserve the optical symmetry of the SRAFs 130. That is, the SRAFs 130 may be axial symmetrical around the isolated features (the second stripes 121).

Figure 1:
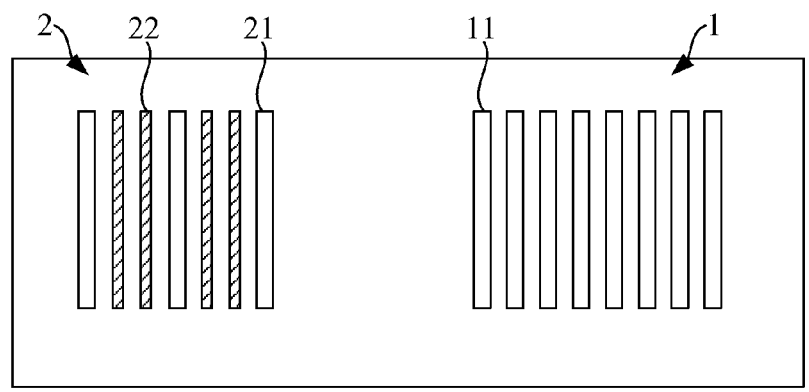
FIG. 1 illustrates an existing photolithographic mask.
Figure 10B:
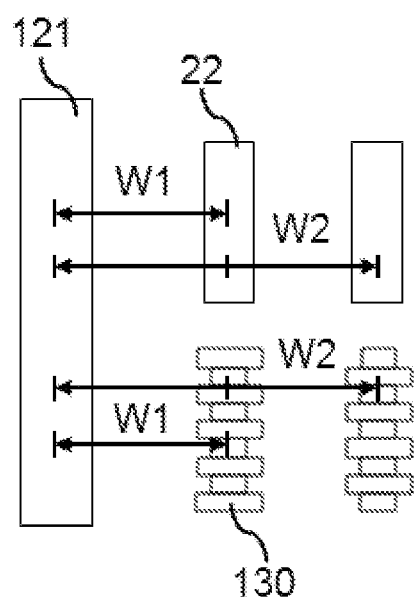

Further, referring to FIG. 10A-10B, the first distance "W1" between the central line of the second stripe 121 and the central lines of two adjacent SRAFs 130 may be equal to the second distance "W2" between the central lines of the stripe patterns 131 of two adjacent SRAFs 130. Therefore, the size of the exposure window of the second stripes 121 along the longitudinal direction may be identical. The pitches between the SRAFs 130 and the second stripes 121 may be same at the pitches of the SRAFs 22 and the isolated features 22 illustrated in FIG. 1. Further, the protruding parts 132 of one SRAF 130 may face portions of the stripe pattern 131 between adjacent protruding parts 132 of the other SRAF 130. Therefore, it may ensure the optical proximity (correction) effect not to be affected in a small region during a photolithography process using the disclosed photolithographic mask. That is, the optical proximity correction effect may be preserved when the SRAFs 130 is used to substitute the SRAFs 22 illustrated in FIG. 1.

In one embodiment, the first distance "W1" may be greater than approximately 70 nm. If the first distance "W1" is equal to, or smaller than 70 nm, it may cause certain unpredictable effects to the feature size and the edge smoothness of the second stripes 121. Thus, the feature size error of the second stripes 121 may become uncontrollable.

Figure 10C:
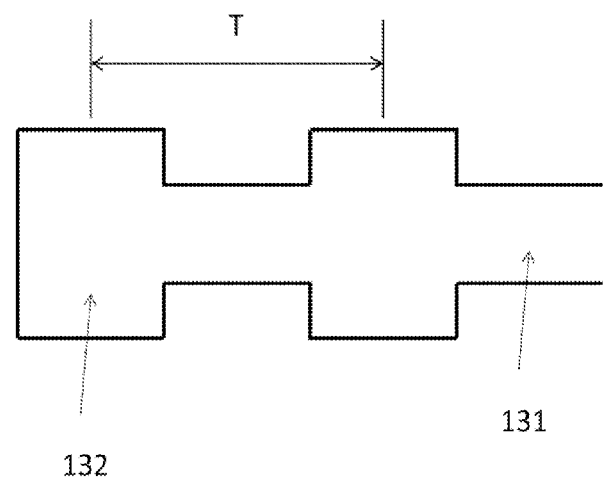

FIG. 10C illustrated a zoom-in view of a portion of the SRAF 130. As shown FIG. 10C, the distance between the centers of two adjacent protruding parts 132 along the longitudinal direction of the strip pattern 131 is referred as "T", which may also be referred as a spatial frequency of the protruding parts 132. In order to obtain a uniform exposure, the distance between adjacent protruding parts 132 along the longitudinal direction of the strip pattern 131 may be equal. In one embodiment, the distance "T" may be greater than the resolving power of the photo lithography system. Such a distance may preserve the ariel intensity distribution of the light passing through the mask. In one embodiment, the distance "T" may be greater than 300 nm. In certain other embodiments, the distance between adjacent protruding parts 132 along the longitudinal direction of the strip pattern 131 may be other appropriate values according to certain requirements.

Further, referring to FIG. 10A, when the SRAFs 130 are disposed at both sides of a second stripe 121, the SRAFs 130 at both sides of the second stripe 121 may be symmetrical with respect to the second stripe 121. Thus, the scattering effect to both sidewalls of the second stripes 121 may be identical.

Figure 10D:
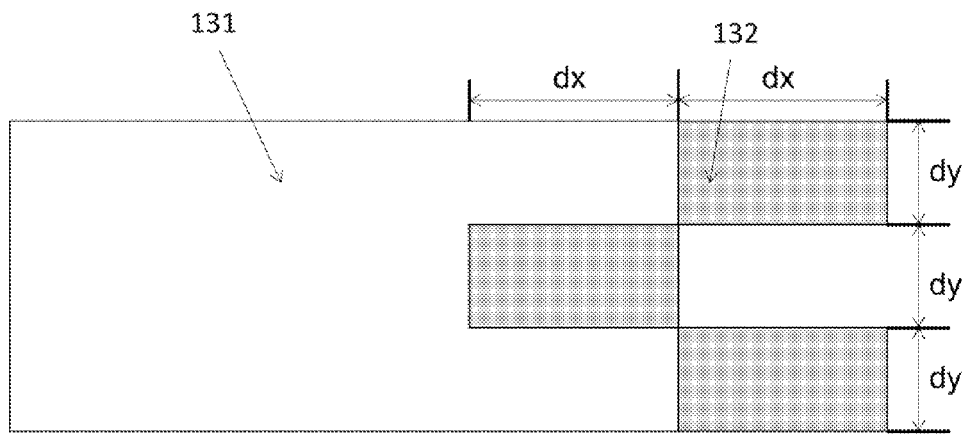

FIG. 10D illustrated a zoom-in view of a portion of the SRAF 130. As shown in FIG. 10D, in one embodiment, the SRAFs 130 may be designed by removing portions of a stripe (not labeled) with a uniform size to the sides of the stripe. That is, portions of the stripe with a size of "dx" by "dy" and an interval of "dy" may be removed to the sides of stripe. The moved portions may be disposed at both sides of the stripe with an interval of "dy". Thus, the size of each of the protruding parts may be two times of "dx" by "dy". Therefore, the average CD of each of the SRAFs 130 may be identical to the CD of each of the SRAFs 22 illustrates in FIG. 1. That is, non-printability of the SRAFs 130 may be preserved. In certain other embodiments, the geometry of the SRAFs 130 may be designed with any appropriate shapes and sizes as long as the non-printability of the SRAFs 130 is preserved.

The layout patterns in the photoresist layer 21 may be formed by any appropriate process, such as a laser direct writing process, a projective electron beam direct writing process, or a scanning electron beam direct writing process, etc. In one embodiment, the layout patterns are written in the photoresist layer 21 by a projective electron direct writing process. Specifically, a focused electron beam may be projected on the photoresist layer 21. The properties of the portion of the photoresist layer 21 exposed by the electron beam may be changed. Comparing with the portion of the photoresist layer 21 without being exposed by the electron beam, the chemical structure of the portion of the photoresist layer 21 exposed by the electron beam may be changed. Thus, the corresponding layout patterns may be written (transferred) to the photoresist layer 21. The un-exposed portion of the photoresist layer 21 may correspond to the position of the layout patterns and the SRAFs 130. The principle of the optical direct writing process and the scanning electron beam direct writing process may be similar with the principle of the electron beam direct writing process. That is, the chemical structure of the exposed portion of the photoresist layer 21 is changed.

Figure 6:
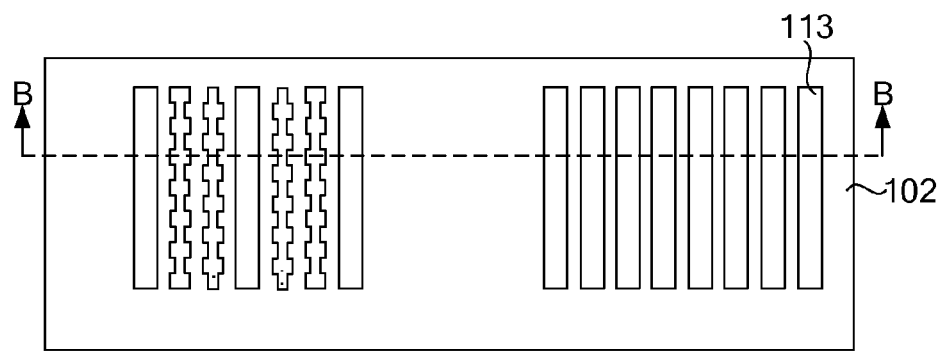
Figure 7:
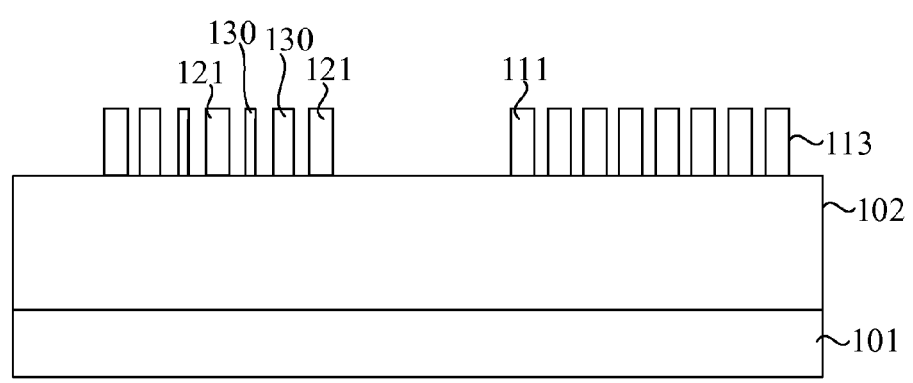

Returning to FIG. 13, after patterning the mask material layer 11 to write the layout patterns with the SRAFs 130 in the mask material layer 11, a patterned photoresist layer may be formed (S104). FIGS. 6-7 illustrate a corresponding structure; and FIG. 7 is a cross-section view of the structure shown in FIG. 6 along the "BB" direction.

As shown in FIGS. 6-7, a patterned photoresist layer 113 is formed. The patterned photoresist layer 113 may be formed by developing or etching the mask material layer 11 to remove the portion of the mask material layer 11 exposed by the electron beam or the exposure light. The patterned photoresist layer 113 may define the layout patterns; and the layout patterns may be transferred to the patterned photoresist layer 113. During the developing process, the portion of the mask material layer 11 with changed chemical structures caused by the exposure process may be etched by the developer. The portion of the mask material layer 11 with the changed chemical structures may have a significantly high etching selectivity compared with the portion of the mask material layer 11 with the unchanged chemical structures. Thus, the portion of the mask material layer 11 with the changed chemical structures may be dissolved in the developer; and the portion of the mask material layer 11 with unchanged chemical structures may be kept to form the corresponding layout patterns and the SRAFs 130.

Figure 8:
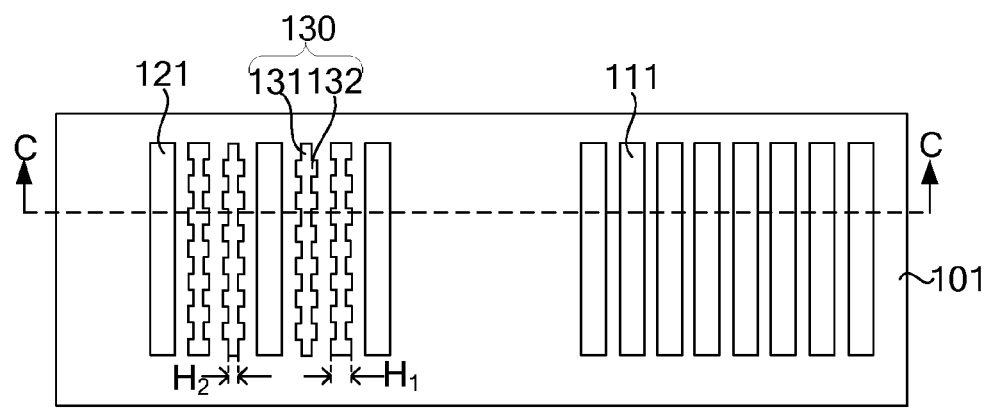
Figure 9:
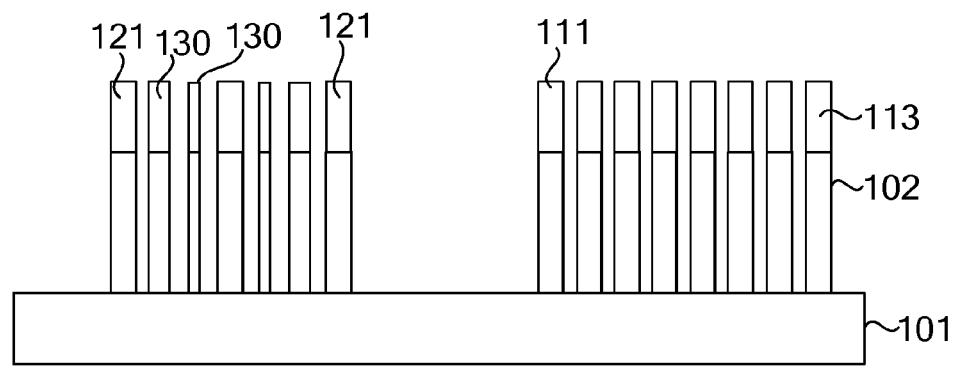

Returning to FIG. 13, after forming the patterned photoresist layer 113, the opaque layer 102 may be etched to transfer the layout patterns and the SRAFs 130 to the opaque layer 102 (S105). FIGS. 8-9 illustrate a corresponding structure; and FIG. 9 is a cross-section view of the structure illustrate in FIG. 8.

As shown in FIGS. 8-9, the layout patterns and the SRAFs 130 formed in the patterns photoresist layer 113 are transferred to the opaque layer 102 by etching the opaque layer 102 using the patterned photoresist layer 113 as an etching mask. The opaque layer 102 may be etched by any appropriate process, such as a dry etching process, or a wet etching process, etc. In one embodiment, a dry etching process is used to etch the opaque layer 102. After forming the layout patterns in the opaque layer 102, a photolithographic mask may be formed. The photolithographic mask may include the opaque layer 102 having the layout patterns, SRAFs 130 and the transparent substrate 101.

During the dry etching process for etching the opaque layer 102, residual matters may be generated, such a chemical reaction products, or contaminations, etc. Therefore, after the dry etching process, a cleaning process may be performed to remove the residual matters generated by the dry etching process. The cleaning process may prevent the residual matters from being adhere on the surface of the transparent substrate 101 and the surface of the opaque layer 102. The photolithographic mask may be immersed into ultra-pure water during the cleaning process. After the cleaning process, residual ultra-pure water may be left on the surface of the photolithographic mask, thus it may need a spin-drying process to remove the residual ultra-pure water after the cleaning process.

Referring to FIGS. 8-9, the first width "H1" of the SRAFs 130 at the positions of the protruding parts 132 is greater than the second width "H2" of the stripe patterns 131. The increased size of the SRAFs 130 at the position of the protruding parts 132 may increase the adhesive force between the SRAFs 130 and the transparent substrate 101. The increased adhesive force of the SRAFs 130 may be able to lower the possibility of SRAFs 130 for tilting and/or peeling off during the spin-drying process. Thus, the SRAFs 130 may have a desired fix positions; and the SRAFs 130 may have a desired completeness. During the exposure process using the photolithographic mask having SRAFs 130 with non-uniform size along the longitudinal direction, the SRAFs 130 may be able to compensate the scattering effect imposed on the second stripes 121. Thus, the scattering effect imposed on the first stripes 111 may be approximately same as the scattering effect imposed on the second stripes 121; and the feature size error of the first stripes 111 may be similar to the feature size error of the second stripes 121.

Returning to FIG. 13, after forming the layout patterns and the SRAFs 130 in the opaque layer 102, the patterned photoresist layer 113 may be removed (S106). FIG. 11A and FIG. 12 illustrate a corresponding structure; and the FIG. 12 is a cross-section view of the structure illustrated in FIG. 11A along D-D line.

As shown in FIG. 11A and FIG. 12, the patterned photoresist layer 113 is removed; and the photolithographic mask is formed. The patterned photoresist layer 113 may be removed by any appropriate process, such as a dry etching process, or a wet etching process, etc. In one embodiment, the patterned photoresist layer 113 is removed by a plasma ashing process. In certain other embodiments, the patterned photoresist layer 113 may be removed before performing the cleaning process.

Referring to FIG. 11B, in certain other embodiments, the corner of the protruding parts 132 of the SRAFs 130 may be rounded because of the photolithography process and the etching process. The protruding parts 132 may be still able to increase the adhesion between the SRAFs and the transparent substrate 101. Thus, the SRAFs 130 may be more robust against the fabrication process of the photolithographic mask. That is, the SRAFs 130 may not be tilted and peeled off after the fabrication process. In certain other embodiments, the layout patterns and the SRAFs 130 may be written in the opaque layer 102 by a focused ion beam etching process. Specifically, the opaque layer 102 may be ion-milled by a focused ion beam (FIB) etching process. The portion of the opaque layer 102 milled by the FIB may be directly removed; and the un-milled portion of the opaque layer 102 may be used as the layout patterns and the SRAFs 130. After the FIB process, residual contaminations may also be left on the surface of the un-milled portion of the opaque layer 102; and a cleaning process and a spin-drying process may be performed to remove the residual contaminations.

Thus, a photolithographic mask may be formed by the above disclosed processes and methods; and the corresponding structure is illustrated in FIG. 11A and FIG. 12. As shown in FIG. 11A and FIG. 12, the photolithographic mask includes a transparent substrate 101. The photolithographic mask also includes an opaque layer 102 formed on the transparent substrate 101. Further, the photolithographic mask includes a plurality of the dense patterns 110 having first stripes 111 formed on in the opaque layer 102. Further, the photolithographic mask also includes a plurality of isolated patterns 102 having second stripes 121 and zig-zag shape SRAFs 130 in between adjacent second stripes 121 formed in the opaque layer 102. The detailed structures and intermediate structures are described above with respect to the fabrication processes.

Therefore, according to the disclosed structures and processes, a plurality of sub-resolution assistant features (SRAFs) with non-uniform size along the longitudinal direction are formed between adjacent isolated patterns of the layout patterns of a photolithographic mask. Comparing with the straight SRAFs, the protruding parts of the SRAFs may increase the adhesion force between the SRAFs and the transparent substrate. Thus, the SRAFs may be more robust against the fabrication process of the photolithographic mask. That is, the SRAFs may not be tilted and peeled off after the fabrication process. Thus, the risk of random defects may be lowered, and the printing quality of the isolated features may be improved.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A photolithographic mask, comprising:
a transparent substrate;
an opaque layer formed on the transparent substrate;
layout patterns with at least a first sub-resolution assistant feature and a second sub-resolution assistant feature with non-uniform size along the longitudinal direction formed in the opaque layer,
wherein:
the layout patterns include a dense patterns and isolated patterns;
the dense patterns includes a plurality of first stripes arranged parallelly;
the isolated pattern includes at least a second stripe and a third stripe arranged parallelly; and
the first sub-resolution assistant feature and the second sub-resolution assistant feature are disposed between the second stripe and the third stripe.

2. The photolithographic mask according to claim 1, wherein:
the first and second sub-resolution assistant features with non-uniform size along the longitudinal direction includes a stripe pattern and a plurality of protruding parts disposed at both sides of the stripe pattern along the longitudinal direction of the stripe pattern.

3. The photolithographic mask according to claim 2, wherein:

the protruding parts of one of the two adjacent sub-resolution assistant features face portions of the stripe pattern of the other sub-resolution assistant feature between adjacent protruding parts along the longitudinal direction of the stripe pattern.

4. The photolithographic mask according to claim 2, wherein:
a first distance between a central line of the second stripes and a central line of the first sub-resolution assistant features is identical to a second distance between the central lines of the first sub-resolution assistant features and a central line of the second sub-resolution assistant feature.

5. The photolithographic mask according to claim 2, wherein:
the protruding parts of each of the first sub-resolution assistant feature and the second sub-resolution assistant feature are distributed with an equal interval along a longitudinal direction of the stripe pattern.

6. The photolithographic mask according to claim 1, wherein:
the first sub-resolution assistant feature and the second sub-resolution assistant feature at both sides of each of the second stripes are symmetrical with respect to the second stripe.

7. The photolithographic mask according to claim 4, wherein:
the first distance and the second distance are greater than approximately 70 nm.

8. The photolithographic mask according to claim 2, wherein:
an average critical dimension of the first and second sub-resolution assistant features is preserved for the non-printability.

9. A photolithographic mask, comprising:
a transparent substrate;
an opaque layer on the transparent substrate; and
layout patterns with at least a first sub-resolution assistant feature and a second sub-resolution assistant feature with non-uniform size along a longitudinal direction to increase an adhesion force between the sub-resolution assistant feature and the transparent substrate in the opaque layer, wherein:
each of the first sub-resolution assistant feature and the second sub-resolution assistant feature comprises a stripe pattern and a plurality of protruding parts;
the first sub-resolution assistant feature is located adjacent to the second sub-resolution assistant feature; and
the plurality of protruding parts of the first sub-resolution assistant feature face portions of the stripe pattern of the second sub-resolution assistant feature.

10. The photolithographic mask according to claim 9, wherein:
the layout patterns include a dense pattern and an isolated pattern;
the dense pattern includes a plurality of first stripes arranged parallelly; and
the isolated pattern includes at least a second stripe and a third stripe arranged parallelly.

11. The photolithographic mask according to claim 9, wherein:
the first sub-resolution assistant feature and the second sub-resolution assistant feature are disposed between the second stripe and the third stripe.

12. The photolithographic mask according to claim 9, wherein:
a first distance between a central line of the second stripe and a central line of the first sub-resolution assistant feature is equal to a second distance between the central line of the first sub-resolution assistant feature and a central line of the second sub-resolution assistant feature.

* * * * *